March 7, 1972 H. WEINERTH 3,647,580

METHOD FOR THE MANUFACTURE OF A SOLID STATE CIRCUIT ADAPTABLE AS H.F. TUNER

Filed June 27, 1968 2 Sheets-Sheet 1

INVENTOR

HANS WEINERTH

BY Philip M. Bolton

ATTORNEY

INVENTOR
HANS WEINERTH
BY Philip M. Bolton
ATTORNEY 3,647,580

METHOD FOR THE MANUFACTURE OF A SOLID STATE CIRCUIT ADAPTABLE AS H.F. TUNER

Hans Weinerth, Eindhoven, Woensel, Netherlands, assignor to International Standard Electric Corporation, New York, N.Y.

Filed June 27, 1968, Ser. No. 740,727
Claims priority, application Germany, July 6, 1967, D 53,520
Int. Cl. H01l 3/00, 5/00, 11/00
U.S. Cl. 148—175 4 Claims

ABSTRACT OF THE DISCLOSURE

This is a method of manufacturing a monolithic H.F. tuner by forming low resistive regions which surrounds a planar transistor and a capacitive diode formed within the substrate. These low resistive regions are formed by subepitaxial diffusion of buried layers in two steps. These low resistive regions are responsible for reducing unwanted barrier layer capacitance and result in better control over the tuning characteristics of the device.

BACKGROUND OF THE INVENTION

This invention relates to manufacturing monolithic solid state high frequency tuners. The present invention is based on the problem of forming an integrated monolithic solid state high frequency tuner having a high frequency transistor arranged in a grounded-base connection, and a capacitance (varactor) diode for effecting the electronic tuning of a resonant circuit consisting of the capacitance diode and an inductance. FIG. 1 shows one such type of high frequency tuner circuit wherein the inductance element is not shown. The transistor is indicated by the reference numeral 1, and the capacitance diode is indicated by the reference numeral 2. When changing-over from a high frequency tuner composed of discrete semiconductor components, to a monolithically integrated type of tuner there arises the problem of adapting the technological steps of processes during the manufacture of the high frequency transistor with the process steps of manufacturing the capacitance diode with a view to obtaining optimum electrical values. In the course of this, especially the series resistances of the individual components and the voltage dependence of the capacity of the capacitance diode have to be taken into consideration. This problem shall first of all be discussed with reference to a possible integration of a monolithic solid state tuner circuit according to FIG. 2 of the drawings.

FIG. 2 shows a semiconductor wafer comprising region 3 of one conductivity type and low impurity concentration, and region 4 is of opposite conductivity type and low impurity concentration the high frequency transistor 1 and the capacitance diode 2 having a pn-junction 7. The emitter zone of the H.F. transistor is indicated by the reference numeral 9, and the collector-base junction is indicated by the reference numeral 10. The collector zone of the H.F. transistor and one layer of the capacitance diode are contacted in common by the ohmic contact 8. The geometries of the regions to be diffused are formed using known planar-diffusion techniques. Owing to the different depths of penetration and conductivity types of the diffused-in zones, the structure according to FIG. 2 when used as a high frequency tuner, has the disadvantage of a relatively weak voltage dependence of the capacity of the capacitance diode. Moreover, the collector series resistance as well as the series resistance of the capacitance diode are prevented from being simultaneously brought to optimum low values.

Finally, and as may be taken from FIG. 2, separate planar diffusions with special masking processes are required for all of the diffused-in zones.

SUMMARY OF THE INVENTION

An object of this invention is to manufacture a monolithic solid state integrated circuit having improved electrical characteristics.

Another object of this invention is to manufacture a monolithic solid state integrated circuit capable of operating as a high frequency tuner with improved electrical characteristics.

The present method relates to a method of manufacturing a monolithic solid state circuit adaptable as a high frequency tuner, said circuit having at least one high frequency transistor, and a capacitance diode having a pn-junction, said transistor having an emitter, base and collector region, the capacitance of said junction being strongly voltage-dependent, comprising the steps of depositing a first layer of material of one conductivity type on a substrate of opposite conductivity type, said substrate having a higher resistivity than said first layer, epitaxially depositing a second layer of material of the same conductivity type and of higher resistivity than said first layer on said first layer and said substrate, forming a first island between said substrate and said second layer by diffusing said first layer into said substrate and said second layer, depositing a third layer of material of the same conductivity type and resistivity as said first layer within the marginal area of said first island on said second layer, epitaxially depositing a fourth layer of material of the same conductivity and resistivity as said second layer on said second and third layers, forming a second island between said second and fourth layers by diffusing said third layer into said second and fourth layers within the marginal area of said first island, and forming active regions within said fourth layer and the marginal area defined by said first and second islands.

DESCRIPTION OF THE PREFERRED EMBODIMENT

Figure 6:
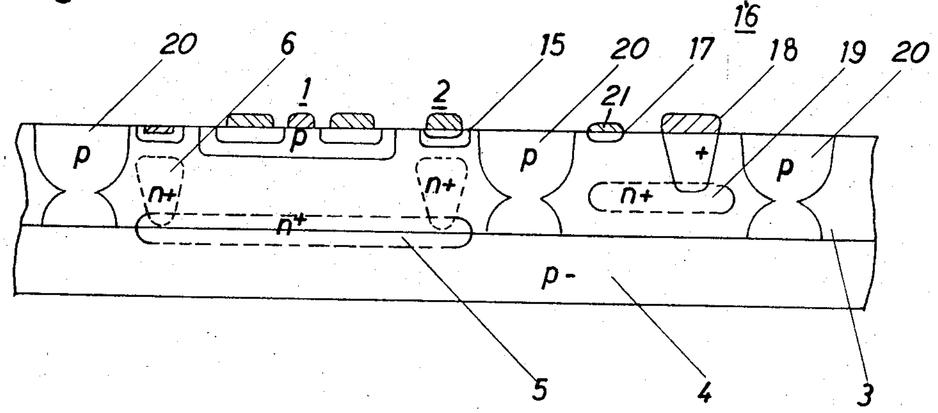
FIG. 6, in a cross-sectional view, shows a monolithic solid state circuit manufactured in accordance with the present invention.

The monolithic solid state circuit shown in FIG. 6 comprises a high frequency transistor, a capacitance diode, and a switching diode. When the monolithic circuit is being used as H.F. tuner, it can be electrically connected to the remaining circuit by applying a suitable biasing potential to the switching diode.

FIGS. 3 to 6 show sections of a wafer which, depending on requirements, may contain further solid state circuits having the corresponding switching diodes for serving as H.F. tuners. The individual circuits may be electrically separated from one another in the conventional way by providing grooves or pn-junctions.

In manufacturing discrete capacitance diodes, and for the purpose of avoiding the formation of surface channels, n-silicon of ½ cm. is usually chosen as the starting material. An $n^+$-diffusion with a depth of penetration of about 1 to 3$\mu$ into the semiconductor body. The resulting impurity profile has a decreasing impurity concentration as the depth of penetration into the semiconductor body increases and results in a voltage sensitive space charge capacitance. A pn-junction is formed within the $n^+$-region by diffusing p-conductivity type impurity material, such as boron into the $n^+$ region. The depth of the pn-junction is generally between 0.3 to 1.5$\mu$.

An aspect of the invention is based on the emitter region of the H.F. transistor having the same impurity profile as the layer ($n^+$ region) of the capacitance diode so that these two regions can be diffused simultaneously. In the course of this it is noticed that the depth of penetration of the emitter region 14 and of the $n^+$ region 15 are approximately the same, as shown in FIG. 4.

Figure 1:
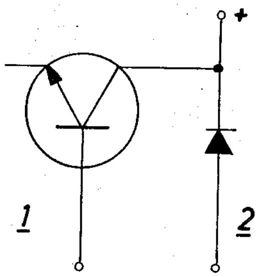
FIG. 1 shows a high frequency tuner circuit without the inductance element.
Figure 2:
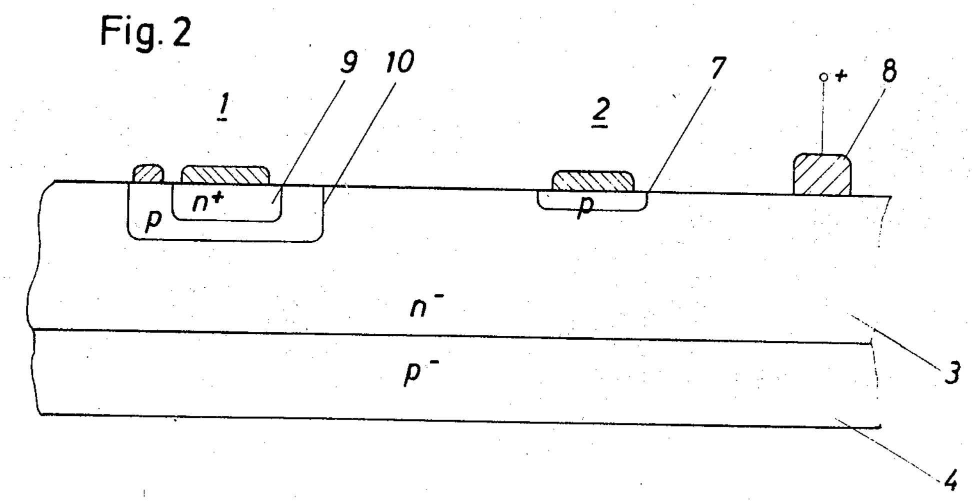
FIG. 2 shows a monolithic solid state integrated circuit tuner.
Figure 3:
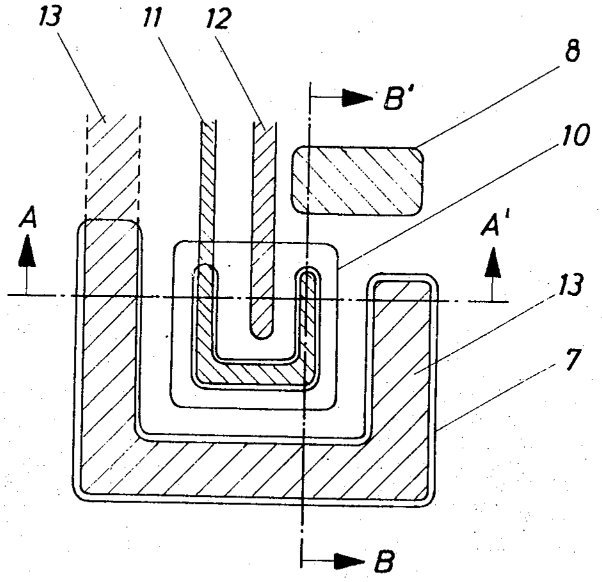
FIG. 3, in a top view, schematically shows the contacting and the zone succession of a monolithic solid state circuit manufactured in accordance with the method as proposed by the present invention.

In manufacturing a monolithic solid state circuit according to FIGS. 3 to 5, the manufacturing steps according to the present invention, are as follows:

A high resistivity p-conductivity type silicon semiconductor wafer 4 can be used as the starting material. A first layer of low resistivity type $n^+$ conductivity type layer is deposited over a portion of wafer 4 using standard diffusion, epitaxial growing, glow discharge or sputtering techniques. A second layer of n-conductivity type material of higher resistivity than the previously described $n^+$ layer is epitaxial grown over the substrate and the first layer of $n^+$ conductivity type. During the epitaxial growth of the second layer, the $n^+$ conductivity type first layer diffuses and expands into the substrate and the second layer forming the first island 5. A third layer of $n^+$ conductivity material of the same resistivity of the first layer is then deposited over the second layer of $n^+$ conductivity type material within the marginal area of the first formed island 5 in the form of an open ring. The third layer may be formed using standard diffusion, epitaxial growing glow discharge or sputtering techniques. A fourth layer of material of n-conductivity type and the same resistivity of the second layer of n-conductivity type material is then epitaxial grown over the second and third layers. The epitaxial grown fourth layer is deposited to a thickness greater than the previously epitaxial grown second layer. During the epitaxial growth of the fourth layer, the third layer forms island 6 which expands into the fully formed n-conductivity type layer 3 and touches previously formed island 5.

Figure 4:
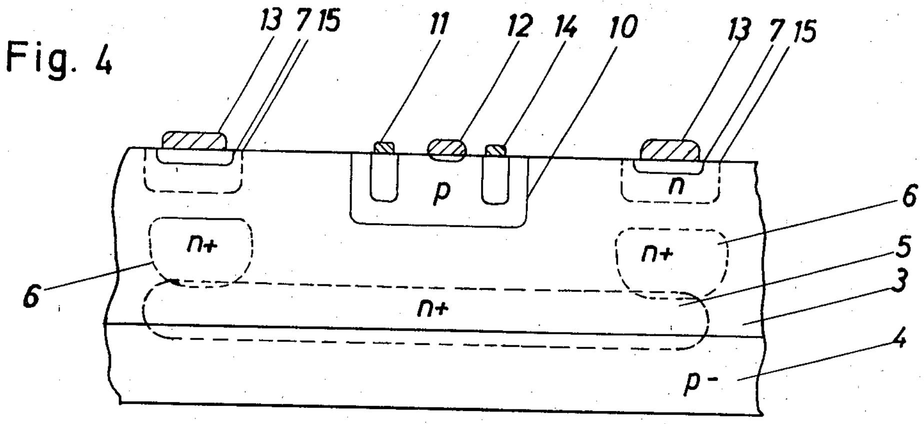
FIG. 4 shows the zone or layer sequence of FIG. 3 in a section taken along line A–A′ of FIG. 3.
Figure 5:
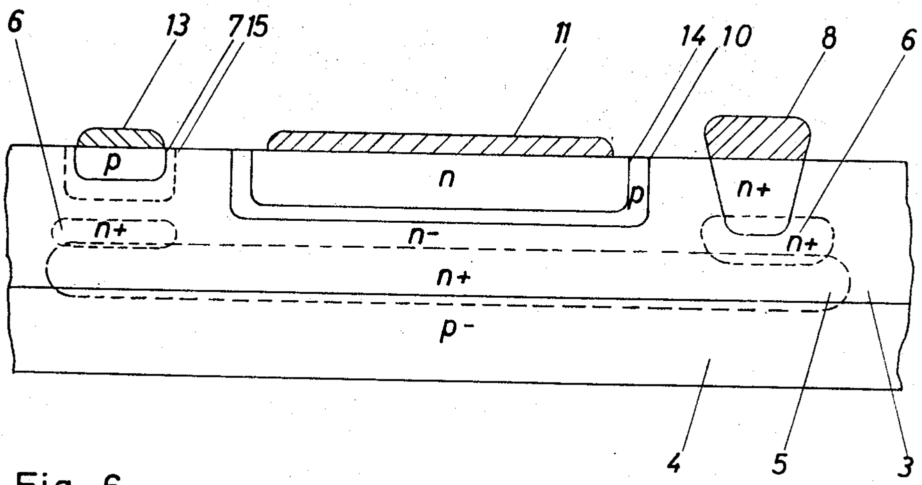
FIG. 5 shows a corresponding sectional view taken on line B–B′ of FIG. 3.

In dimensioning the layers and controlling the diffusion processes we obtain the desired structure shown in FIGS. 4 and 5. After the epitaxial application of the second semiconductor layer, by employing the well-known planar method, and in accordance with the geometry as shown in FIGS. 3 to 5, there is established the collector-base junction 10 of the H.F. transistor and, together with the diffusion of the region 14, there is carried out the diffusion of region 15 of the capacitance diode and, subsequently thereto, the diffusion for manufacturing the pn-junction 7 of the capacitance diode. After islands 5 and 6 are so formed as to contact each other, contact 8 is formed from an alloy material, and is driven toward the inside of the semiconductor wafer in an increasing temperature gradient. The silicon semiconductor wafer on the side opposite the alloy contact is heated to a temperature of about 1000° C., and is kept cool on the contact side. With relatively small amounts of alloying material, this method results in relatively great and well-reproducible alloying depth. The conductor leads 11, 12 and 13, extending outside the contacting areas above the layer of silicon oxide, are applied respectively to the emitter and base of the transistor and the capacitance diode. By the method according to the present invention the highly doped islands 5 and 6 may be brought arbitrarily close to the junctions 7 or 10 respectively. In this way it is possible to achieve optimum low series resistances in the case of all individual elements of the solid state circuit.

FIG. 6 shows a monolithic solid state circuit capable of being used as a high frequency tuner with an electronic switch. This circuit additionally comprises a switching diode 16 with the pn-junction 17, the ohmic contacts 18 and 21, and a low-resistive island 19. The diode 16 which is capable of being used as a switch, is electrically separated from the remaining solid state circuit, just as the latter is with respect to further elements, with the aid of diffused insulating zones 20. The necessary additional diffusions with respect to the manufacture of a solid state circuit according to FIGS. 3 to 5 may be combined in such a way with the method according to the present invention, that no additional steps of operation become necessary. In manufacturing the switching diode 16 there may be omitted the planar-diffusions for manufacturing the zone 15 and the island 5 which are necessary with respect to the capacitance diode 2. An island corresponding to the island 5 below the switching diode *f6* would detrimentally increase the parasitic capacitance with respect to the substrate.

In contacting the zones of a solid state circuit comprising a plurality of transistor-capacitance diode pairs, the conducting leads must be arranged carefully in such a way as to avoid any unwanted couplings of the inductances assigned thereto. The contacting of the islands 6 and 19 by way of alloying in the temperature gradient as described hereinbefore, and in connection with the method according to the present invention, has the particular importance that low temperatures may be employed for the contacting so that the once adjusted characteristic values of the capacitance diode 2 which are determined by the impurity profile at the junction 7 will no longer be subject to changes in the course of the further diffusion of impurities.

I claim:

1. A method of manufacturing a monolithic solid state circuit adaptable as a high frequency tuner, said circuit having at least one high frequency transistor and a capacitance diode having a pn junction, said transistor having an emitter, base and collector region, the capacitance of said junction being strongly voltage-dependent by employing the planar diffusion method and epitaxial deposition, comprising the steps of:

depositing a first layer of material of one conductivity type on a portion of a substrate of opposite conductivity type, said substrate having a higher resistivity than said first layer;

epitaxially depositing a second layer of material of the same conductivity type and of higher resistivity than said first layer on said first layer and said substrate;

forming a first island between said substrate and said second layer by subepitaxially diffusing said first layer into said substrate and said second layer;

depositing a third layer of material of the same conductivity type and resistivity as said first layer and patterned in a ring shape within the marginal area of said first island and on said second layer;

epitaxially depositing a fourth layer of material of the same conductivity and resistivity as said second layer on said second and third layers;

forming a ring shaped region between said second and fourth layers by diffusing said third layer into said second and fourth layers within the marginal area of said first island until said ring shaped region touches said first island; and forming active regions within said fourth layer and the marginal area defined by said first island and said ring shape region.

2. A method of manufacturing a monolithic solid state circuit adaptable as a high frequency tuner according to claim 1, wherein said first island, ring shaped region is contacted within said semiconductor wafer by the alloying-in of alloy material in the temperature gradient of an increasing temperature.

3. A method of manufacturing a monolithic solid state circuit adaptable as a high frequency tuner according to claim 1, wherein the pn-junction of said capacitance diode is designed to partly enclose or surround the base zone of said transistor.

4. A method of manufacturing a monolithic solid state circuit adaptable as a high frequency tuner according to claim 1, wherein said fourth layer is epitaxially deposited to a degree of thickness greater than said second layer.

References Cited

UNITED STATES PATENTS

| | | | |
|---|---|---|---|
| 3,327,182 | 6/1967 | Kisinko | 317—235 |
| 3,335,341 | 8/1967 | Lin | 317—235 |
| 3,341,755 | 9/1967 | Husher et al. | 317—235 |
| 3,441,815 | 4/1969 | Pollock et al. | 148—187 X |
| 3,164,498 | 1/1965 | Loeb et ayl. | 148—177 |
| 3,180,766 | 4/1965 | Williams | 148—33 |
| 3,260,902 | 7/1966 | Porter | 317—235 |
| 3,164,498 | 1/1965 | Loeb et al. | 148—177 |
| 3,370,995 | 2/1968 | Lowery et al. | 148—175 |
| 3,387,193 | 6/1968 | Donald | 317—235 |
| 3,460,006 | 8/1969 | Strull | 317—235 |
| 3,481,801 | 12/1969 | Hugle | 29—577 X |
| 3,494,809 | 2/1970 | Ross | 148—175 |
| 3,506,893 | 4/1970 | Dhaka | 29—569 X |

FOREIGN PATENTS

| | | | |
|---|---|---|---|
| 1,422,157 | 11/1965 | France | 48—175 UX |

OTHER REFERENCES

Augusta et al.: "Component Interconnection for Integrated Circuits," IBM Technical Discl. Bull., vol. 8, No. 12, May 1966, pp. 1843-4.

L. DEWAYNE, RUTLEDGE, Primary Examiner

W. G. SABA, Assistant Examiner

U.S. Cl. X.R.

29—572; 117—201, 212; 148—33, 178, 187, 191; 317—235